(12) United States Patent
Coolbaugh et al.

(10) Patent No.: US 7,528,048 B2
(45) Date of Patent: May 5, 2009

(54) PLANAR VERTICAL RESISTOR AND BOND PAD RESISTOR AND RELATED METHOD

(75) Inventors: Douglas D. Coolbaugh, Essex Junction, VT (US); Timothy J. Dalton, Ridgefield, CT (US); Daniel C. Edelstein, White Plains, NY (US); Ebenezer E. Eshun, Newburgh, NY (US); Jeffrey P. Gambino, Westford, VT (US); Kevin S. Petrarca, Newburgh, NY (US); Anthony K. Stamper, Williston, VT (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/954,782

(22) Filed: Dec. 12, 2007

(65) Prior Publication Data

US 2008/0132027 A1    Jun. 5, 2008

Related U.S. Application Data

(62) Division of application No. 11/307,404, filed on Feb. 6, 2006, now Pat. No. 7,394,110.

(51) Int. Cl.
*H01L 21/20* (2006.01)

(52) U.S. Cl. .................. 438/382; 438/21; 438/50; 438/330

(58) Field of Classification Search ............... 257/154, 257/350, 358, 359, 363, 379–381, 516, 533, 257/536–543, 571, 572, 577, 580–582, 904; 438/382, 384, 21, 50, 238, 330
See application file for complete search history.

(56) References Cited

U.S. PATENT DOCUMENTS

| | | |
|---|---|---|
| 4,695,853 A | 9/1987 | Hackleman et al. |
| 5,899,724 A | 5/1999 | Dobuzinsky et al. |
| 6,144,144 A | 11/2000 | Cleeves et al. |
| 6,580,130 B1 * | 6/2003 | Schoellkopf et al. ........ 257/350 |
| 2002/0020879 A1 | 2/2002 | Shiiki et al. |

* cited by examiner

*Primary Examiner*—Evan Pert
*Assistant Examiner*—Scott R Wilson
(74) *Attorney, Agent, or Firm*—Hoffman Warnick LLC; Lisa Jaklitsch

(57) ABSTRACT

Resistors that avoid the problems of miniaturization of semiconductor devices and a related method are disclosed. In one embodiment, a resistor includes a planar resistor material that extends vertically within at least one metal layer of a semiconductor device. In another embodiment, a resistor includes a resistor material layer extending between a first bond pad and a second bond pad of a semiconductor device. The two embodiments can be used alone or together. A related method for generating the resistors is also disclosed.

3 Claims, 7 Drawing Sheets

US 7,528,048 B2

PLANAR VERTICAL RESISTOR AND BOND PAD RESISTOR AND RELATED METHOD

The current application is a divisional application of U.S. patent application Ser. No. 11/307,404, filed on Feb. 6, 2006, now U.S. Pat. No. 7,394,110 which is hereby incorporated by reference.

BACKGROUND OF THE INVENTION

1. Technical Field

The invention relates generally to semiconductor devices, and more particularly, to a planar vertically extending resistor and/or a bond pad resistor that avoid miniaturization issues in semiconductor devices.

2. Background Art

Precision resistors have become essential for analog and mixed signal applications. Conventional metal back-end-of-line (BEOL) resistors are typically integrated as horizontal inserts in BEOL metal lines. FIG. 1 shows an illustrative conventional precision resistor 10. Precision resistor 10 is placed within a dielectric via layer 12 atop, for example, a silicon dioxide layer 14 and hydrogenated oxysilicon carbide layer (SiCOH) 16. An etch stop layer 20 covers resistor 10. As metal lines 22 have continued to be miniaturized, however, the thicknesses have approached dimensions that are close to or less than the thickness of precision resistor 10. As a result, continued use of horizontal resistors is impossible because it is unfeasible to insert the horizontal resistor in the thinner layers. For example, a via 24 on top of precision resistor 10 is as thin as resistor 10 such that a gap between metal line 22 is not large enough to include the via and the precision resistor.

In view of the foregoing, there is a need in the art for an alternative integration scheme and structure to provide precision resistors in BEOL wiring.

SUMMARY OF THE INVENTION

Resistors that avoid the problems of miniaturization of semiconductor devices and a related method are disclosed. In one embodiment, a resistor includes a planar resistor material that extends vertically within at least one metal layer of a semiconductor device. In another embodiment, a resistor includes a resistor material layer extending between a first bond pad and a second bond pad of a semiconductor device. The two embodiments can be used alone or together. A related method for generating the resistors is also disclosed.

A first aspect of the invention provides a resistor for a semiconductor device, the resistor comprising: a planar resistor material extending vertically within at least one metal layer.

A second aspect of the invention provides a resistor comprising: a resistor material layer extending between a first bond pad and a second bond pad of a semiconductor device.

A third aspect of the invention provides a method of providing a back-end-of-line resistor, the method comprising the steps of: providing a substrate; and forming at least one of the following: a planar resistor material extending vertically within at least one metal layer over the substrate, and a resistor material layer extending between a first bond pad and a second bond pad of a semiconductor device.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
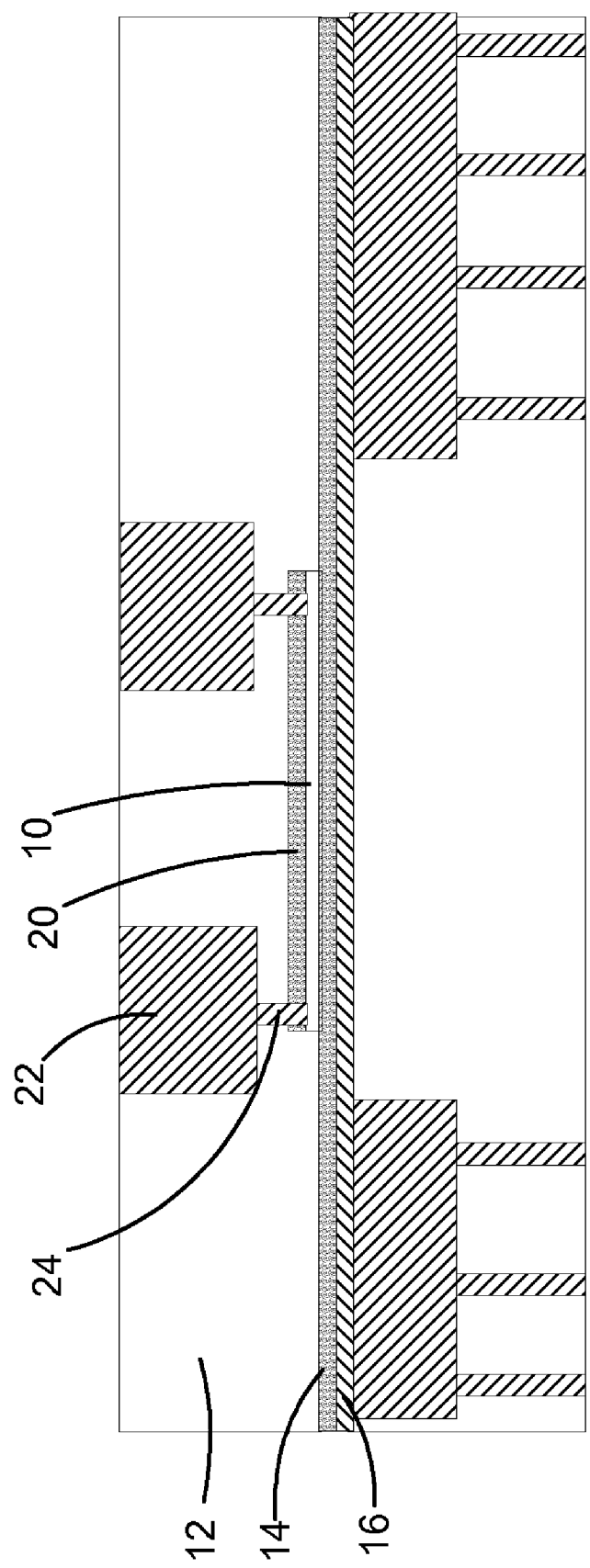
FIG. 1 shows a prior art resistor.

It is noted that the drawings of the invention are not to scale. The drawings are intended to depict only typical aspects of the invention, and therefore should not be considered as limiting the scope of the invention. In the drawings, like numbering represents like elements between the drawings. However, like cross-hatching does not necessarily indicate like materials.

DETAILED DESCRIPTION

Figure 2:
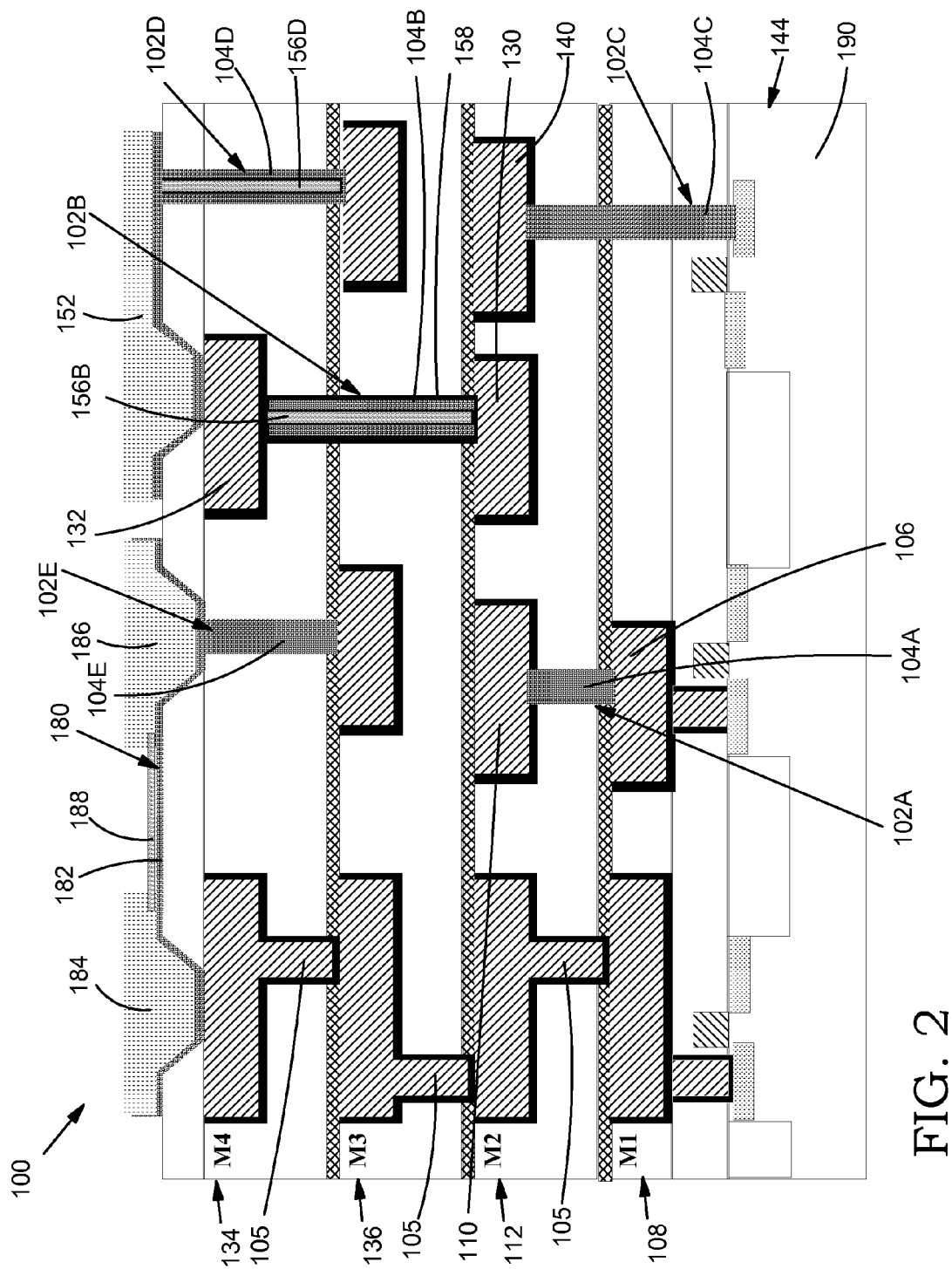
FIG. 2 shows various embodiments of a resistor according to the invention.

Referring to the drawings, FIG. 2 shows a cross-sectional view of a semiconductor device 100 including various embodiments of a resistor 102A-E according to the invention. In one embodiment, a resistor 102A-D includes a planar resistor material 104A-E extending vertically within at least one metal layer 108, 112, 134, 136. The resistor material is referred to as "planar" because it extends, in contrast to vias 105, in a vertical plane into and out of the page as shown in cross-section. (The far left side of FIG. 2 illustrates conventional metal wire/via interconnections.) Various alternatives of the resistor are shown in FIG. 2. In particular, in a first embodiment shown in FIG. 2, planar resistor material 104A may extend vertically from a first metal terminal 106 in a first metal layer 108 to a second metal terminal 110 in a second metal layer 112. (The denotations "first," "second," "third," etc., are used for metal layers for differentiation purposes only, and are not meant to indicate positions within semiconductor device 100.) Similarly, resistor 102B includes planar resistor material 104B that extends vertically from a first metal terminal 130 in a first metal layer 112 to a second metal terminal 132 in a second metal layer 134. As shown for resistor 102B, planar resistor material 104B may vertically extend through at least one other metal layer 136. As shown for resistor 102C, planar resistor material 104C may also terminate at a metal terminal 140 in a first metal layer 112 and at a polyconductor layer 144. As shown for resistor 102D, planar resistor material 104D may extend from a last metal layer 134 to a first bond pad 152.

Each metal terminal 106, 110, 130, 132, 140 preferably includes copper (Cu) or aluminum (Al), and may extend the length of planar resistor material 104A-E, i.e., into and out of page, or they may be provided in a spot metal configuration. Planar resistor material 104A-E may include tantalum nitride (TaN), tungsten (W), tantalum (Ta), silicon chromide (SiCr), chromium (Cr), titanium nitride (TiN), zirconium nitride (ZrN), titanium-zirconium nitride (TiZrN), tungsten nitride (WN), tungsten-silicon nitride (WSiN), tantalum-silicon nitride (TaSiN), or any other later developed resistor material.

As shown relative to resistors 102B and 102D, planar resistor material 104B, 104D may also include a non-conductive core 156B, 156D, which assists in thermal conductivity. Non-conductive core 156B, 156D material may be selected from the group consisting of a dielectric material, e.g., silicon dioxide ($SiO_2$), silicon carbide (SiC), silicon nitride ($Si_3N_4$), diamond-like carbon (C), aluminum nitride (AlN), carbon nano-tubes, and an organic material, e.g., spin-on silicon dioxide ($SiO_2$), organic polymers such as ACCUFLO® from Honeywell and NFC-1400 available from Japan Synthetic Rubber, SiLK® available from Dow Chemical or Shumaecher PAE-2. Planar resistor material 104B, 104D may also include a liner 158 such as silicon dioxide ($SiO_2$), silicon carbide (SiC), silicon nitride ($Si_3N_4$), tantalum (Ta), tantalum nitride (TaN), titanium nitride (TiN), if desired, e.g., to prevent material interactions.

Continuing with FIG. 2, in another embodiment, a resistor 180 may include a resistor material layer 182 extending between a first bond pad 184 and a second bond pad 186. Resistor material layer 182 may include, for example, tantalum nitride (TaN), and bond pads 184, 186 may include any now known or later developed pad material such as aluminum (Al). An insulator layer 188, e.g., silicon dioxide ($SiO_2$), may extend over resistor material layer 182 between first bond pad 184 and second bond pad 186 to insulate and protect resistor material layer 182.

The above-described resistor embodiments 102A-E and 180 may be provided alone or in combination. FIG. 2 shows use of a combination in how planar resistor material 104E of resistor 102E is interconnected to resistor material layer 182 of resistor 180, so as to form an integral resistor. A value of a resistance of each resistor 102A-E and, hence, planar resistor material 104A-E is determined by a height of the planar resistor material 104A-E. The resistance may also be determined based on the location of metal terminals along a horizontal length of each planar resistor material 104A-E. A value of a resistance of resistor 180 may be determined by a thickness of resistor material layer 182.

Another embodiment of the invention includes a method of providing a back-end-of-line (BEOL) resistor. One embodiment of the method includes, as shown in a completed form in FIG. 2, providing a substrate 190; and forming at least one of the following: a planar resistor material 104A-E extending vertically within at least one metal layer over substrate 190, and a resistor material layer 182 extending between first bond pad 184 and second bond pad 186 of semiconductor device 100. FIGS. 3A-F show one embodiment of a method of forming a resistor 102A-C, and 102E including planar resistor material 104A-E, FIGS. 4A-D show one embodiment of a method of forming resistor material layer 182, and FIGS. 5A-D show one embodiment of a method of forming a resistor 102D including planar resistor material 104D. It should be recognized that the embodiments described below for forming resistors 102A-E and 180 are only illustrative and that other methods are possible and considered within the scope of the invention.

Figure 3A:
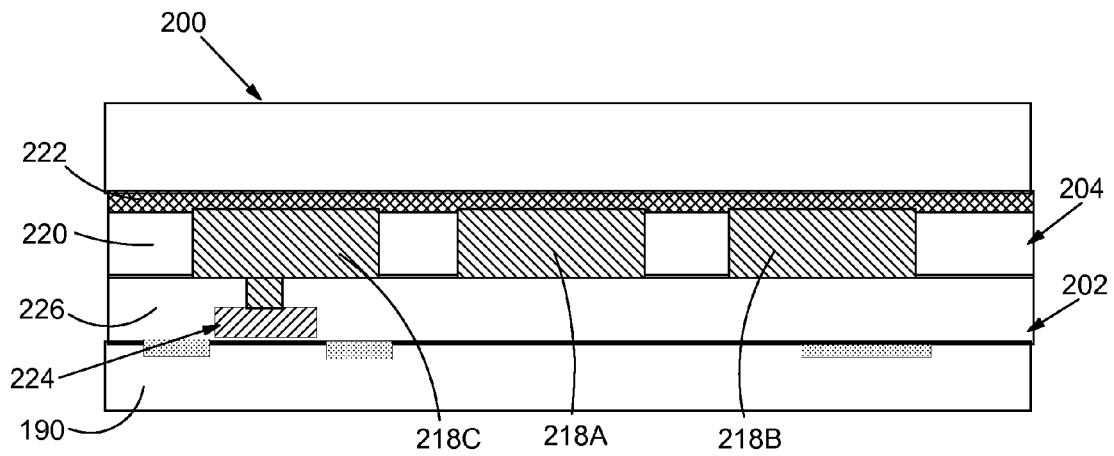
FIGS. 3A-F show one embodiment of a method of forming one embodiment of a resistor shown in FIG. 2.

Turning to FIG. 3A, a preliminary step for forming a resistor 102A-C and 102E (FIG. 2) includes providing a preliminary structure 200 including the structure to which a resistor is to be initiated, i.e., a PC layer 202 or a metal layer 204. As shown, preliminary structure 200 includes a metal layer 204 over a PC layer 202. However, it should be recognized that where a resistor 102C (FIG. 2) is to be connected to a PC layer 202 alone, preliminary structure 200 would not include a metal terminal over the areas of connection for the resistor. Metal layer 204 may include metal portions 218A-C in a low-k dielectric material 220 and a cap layer 222 of, for example, silicon nitride ($Si_3N_4$), thereover, as is conventional. PC layer 202 may include a transistor structure 224 formed in, for example, a boro-phosphorous silica glass (BPSG) 226 over substrate 190, as is conventional.

Figure 3B:
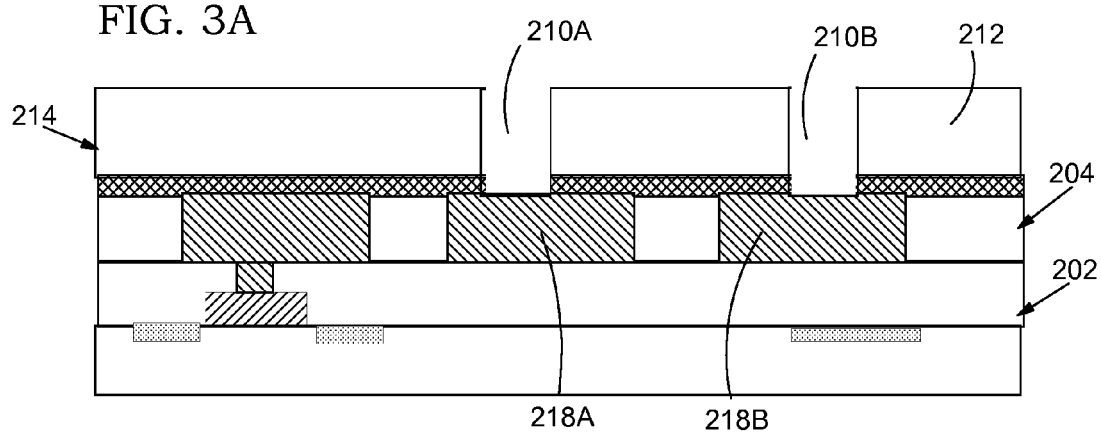
Figure 3C:
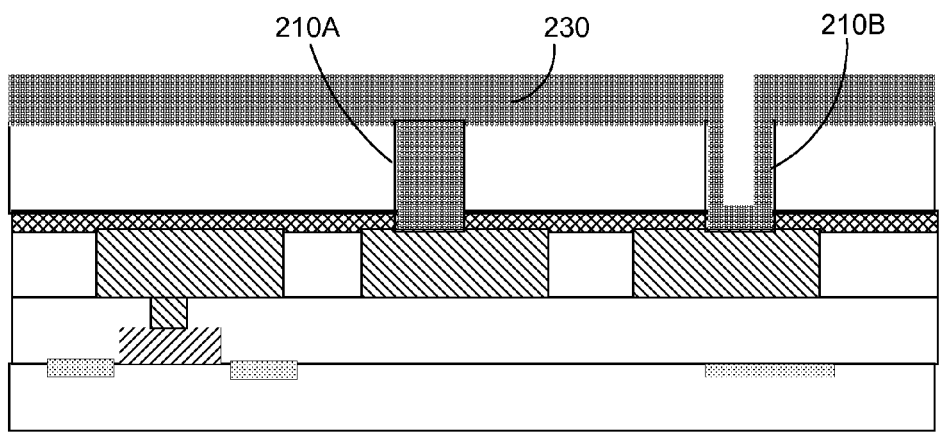
Figure 3D:
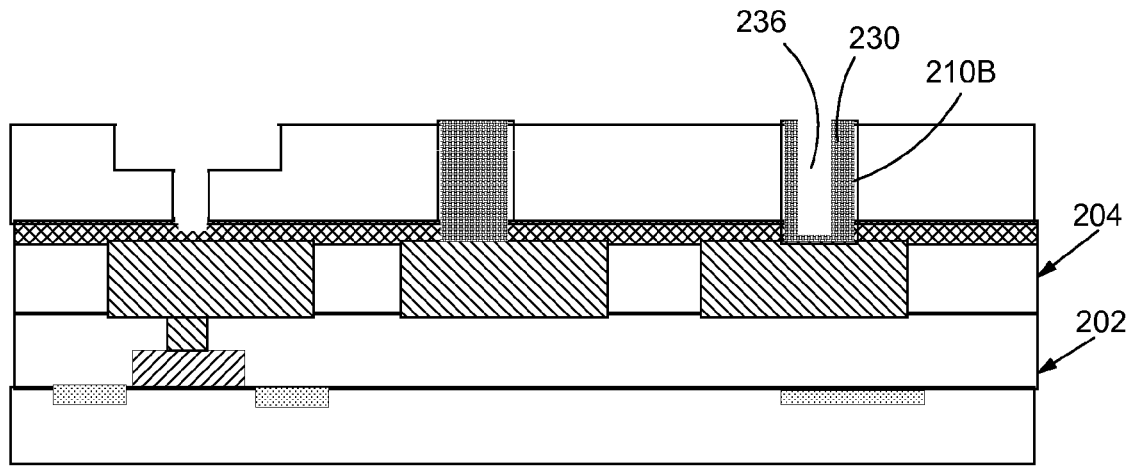

FIG. 3B shows a first step including forming a trench 210A, 210B (only one necessary) in a dielectric layer 212 of a first metal layer 214. Trench 210A, B reveals a metal portion 218A, 218B of a second metal layer 204 thereunder. If the resistor 102D (FIG. 2) to be generated in a last metal layer 134 (FIG. 2), then the trench opening can be formed as part of the opening steps for a terminal via (not shown). In FIG. 3C, resistor material 230 is deposited in each trench 210A, 210B, e.g., using physical vapor deposition (PVD), atomic layer deposition (ALD) or chemical vapor deposition of TaN. Prior to this step, a liner 158 (FIG. 2) may be deposited within selected trenches 210A, 210B, if desired, in any now known or later developed fashion. Next, as shown in FIG. 3D, resistor material 230 is planarized, which may include chemical mechanical polishing and/or an etching to remove a portion of resistor material 280. The right side of FIG. 3D illustrates the step of forming a non-conductive core 156B (FIG. 2) in a resistor 102B (FIG. 2). In this case, resistor material 230 is deposited within a selected trench 210B followed by non-conductive core material (e.g., silicon dioxide ($SiO_2$) into a remaining opening 236 by plasma enhanced chemical vapor deposition (PECVD)), which is followed by planarizing to remove excess non-conductive core material, e.g., chemical etch back of $SiO_2$.

Figure 3E:
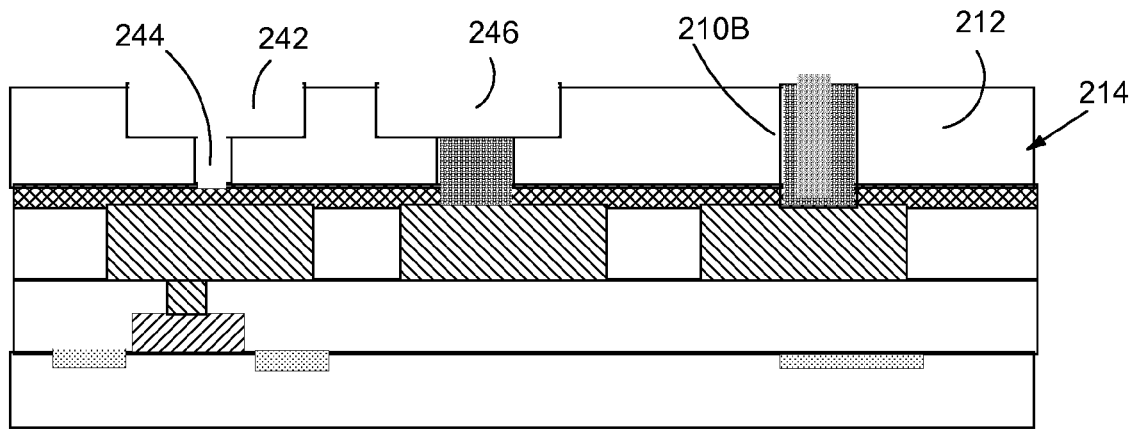
Figure 3F:
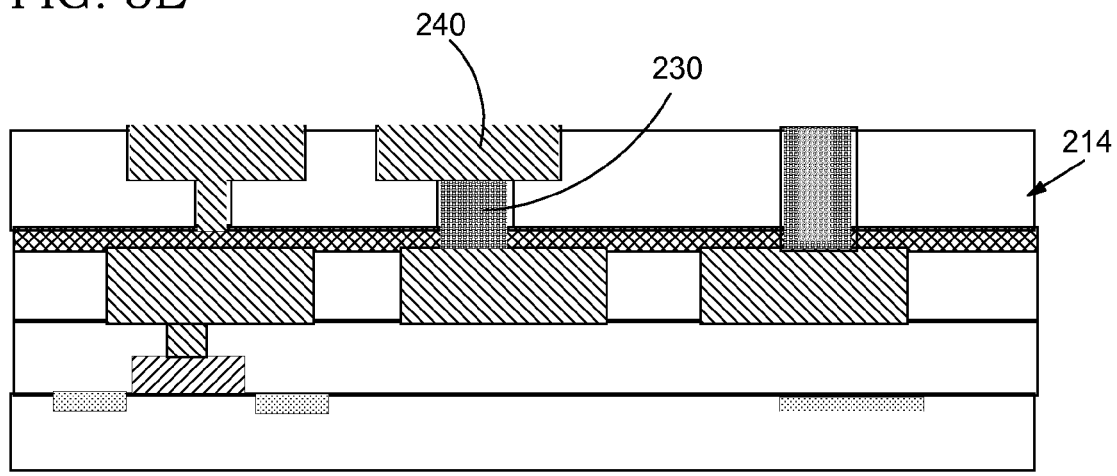

Referring to FIGS. 3E-3F, if the resistor is to terminate in first metal layer 214 of dielectric layer 212, then the next step includes forming a metal terminal 240 (FIG. 3F) which contacts resistor material 230 in first metal layer 214. In one embodiment, this step may be provided as part of a dual damascene process for other metal wiring/via connections, e.g., opening a via opening 242, metal wire opening 244 and metal terminal opening 246, as shown in FIG. 3E. Next, as shown in FIG. 3F, any required liner and a metal (e.g., copper or aluminum) would be deposited. The metal would be planarized to form metal terminal 240. Returning to FIG. 3E, if the resistor (resistor material 230 (FIG. 3F only)) is to pass through another metal layer, e.g., as for the resistor being built in trench 210B, then the next step includes forming the at least one other metal layer atop first metal layer 204. This step would include forming a resistor material filled trench contacting the underlying resistor material 230 of the underlying metal layer for each metal layer through which the resistor is to pass so as to form an integral resistor. This step may include for each metal layer: depositing a dielectric, e.g., low-k dielectric, opening a trench therein commensurate with the trench of the layer below, filling the trench with resistor material and planarizing. Other structures typical of a metal layer may be generated also.

Figure 4A:
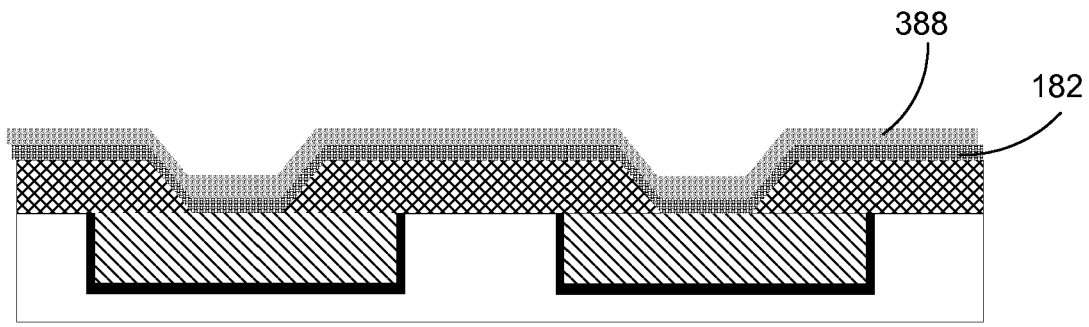
FIGS. 4A-D show one embodiment of a method of forming another embodiment of a resistor shown in FIG. 2.
Figure 4B:
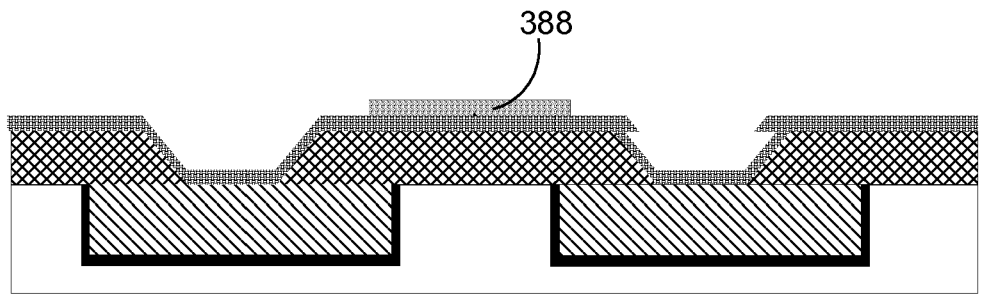
Figure 4C:
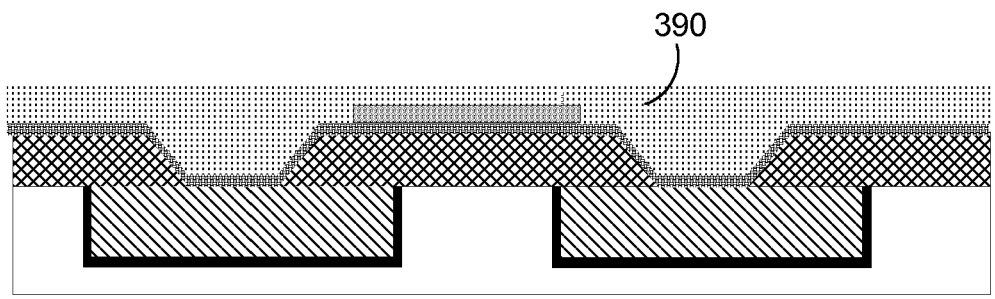
Figure 4D:
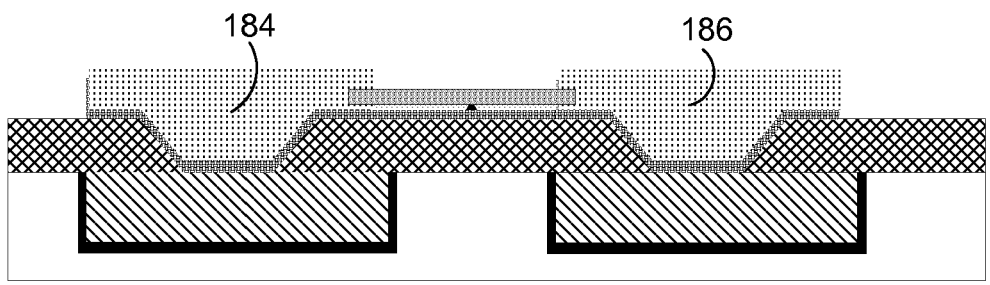

Turning to FIGS. 4A-4D, one embodiment of forming a resistor 180 (FIG. 2) will now be described. In a first step shown in FIG. 4A, resistor material layer 182 and then an insulator layer 388 is deposited, e.g., by PVD or PECVD. Next, as shown in FIG. 4B, insulator layer 388 is patterned using, for example, conventional lithography and a reactive ion etch (RIE), to form insulator layer 182 (FIG. 2). FIG. 4C shows a next step of depositing bond pad material 390, e.g., aluminum (Al) by PVD. FIG. 4D shows the step of patterning bond pad material 390 (FIG. 4C) into bond pads 184, 186. Note that resistor material layer 182 is also patterned during this step, with insulator layer 388, providing a mask.

Figure 5A:
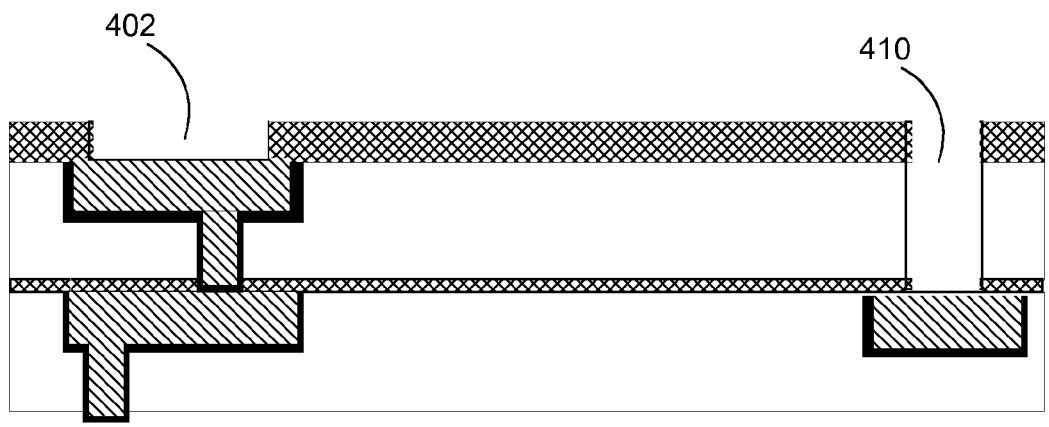
FIGS. 5A-D show one embodiment of a method of forming yet another embodiment of a resistor shown in FIG. 2.
Figure 5B:
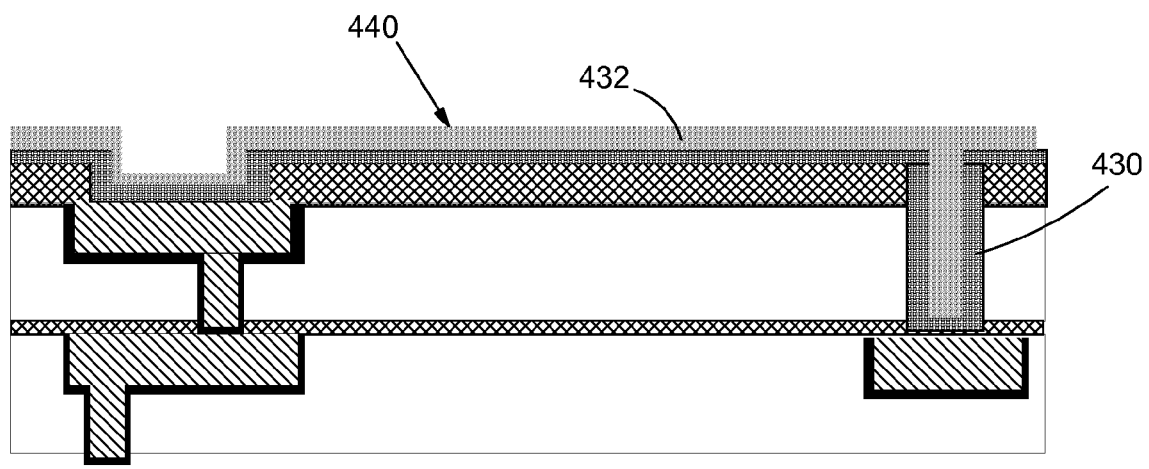
Figure 5C:
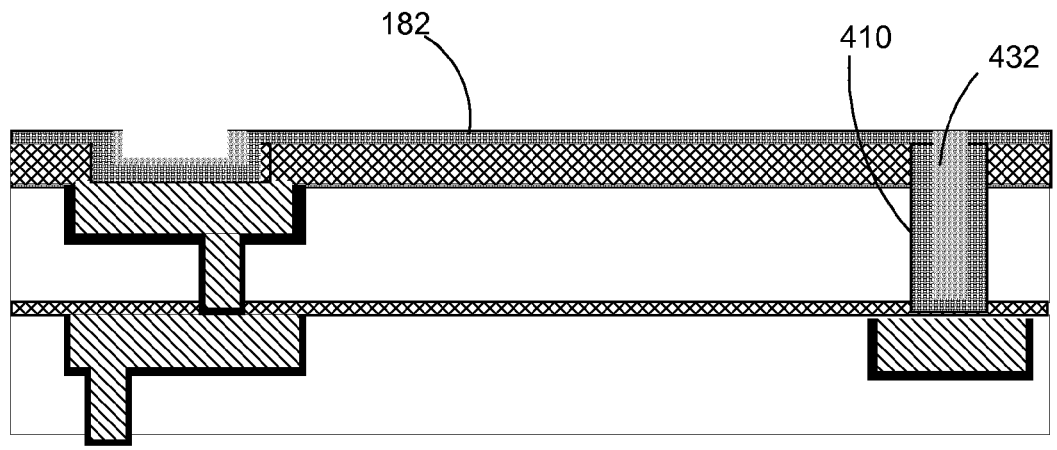
Figure 5D:
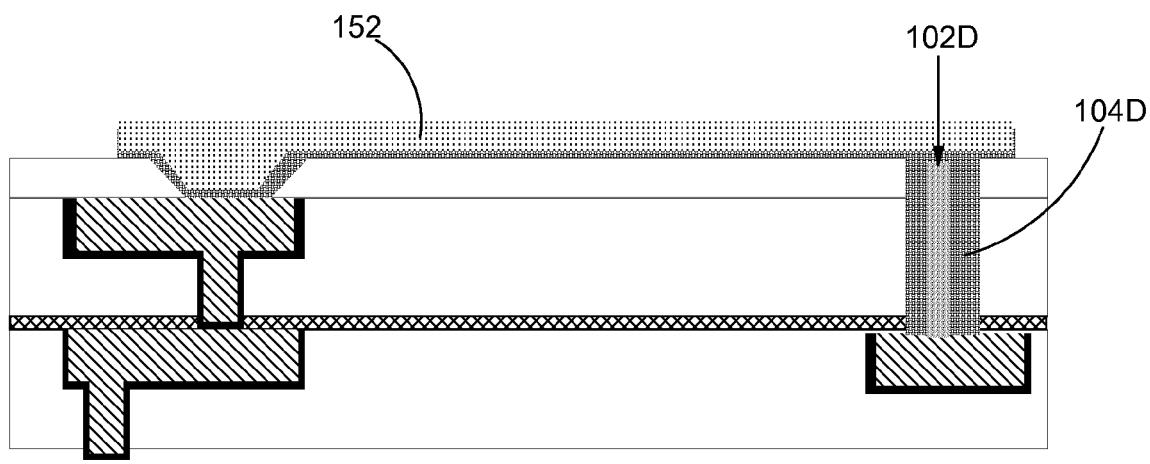

FIGS. 5A-5D show formation of a resistor 102D (FIG. 2) that is substantially similar to the steps shown above relative to FIG. 3D. (Note, the structure of FIGS. 5A-5D is slightly different than FIG. 2 for clarity purposes). In a first step shown in FIG. 5A, a terminal via opening 402 and a resistor trench 410 are formed in a conventional manner, i.e., patterning and etching. Next, as shown in FIG. 5B, resistor material 430 is deposited within resistor trench 410 (FIG. 5A) followed by non-conductive core material 432 (e.g., silicon dioxide ($SiO_2$) by plasma enhanced chemical vapor deposition (PECVD), which is followed by planarizing to remove excess non-conductive core material, e.g., chemical etch back of $SiO_2$. Next, as shown in FIG. 5C, non-conductive core material 432 is planarized, e.g., etched back by RIE. Resistor material 182 is then etched back using RIE, but remains in resistor trench 410, where it is protected by core material 432. FIG. 5D shows resistor 102D after formation of terminal deposition, e.g., by PVD, and patterning of terminal material, e.g., aluminum (Al) by lithography and RIE, to form terminal 440.

Implementing the above-described invention allows generating a wide range of resistances without concerns about whether the resistor will fit within a horizontal space in a layer. The above-described invention is capable of use with a wide range of applications. In one example, the bond pad implementation provides a stable resistance for high frequency applications.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of providing a back-end-of-line resistor, the method comprising the steps of:
   providing a substrate; and
   forming at least one of the following:
      a planar resistor material extending vertically within at least one metal layer over the substrate and extending vertically from a first metal terminal in a first metal layer to a second metal terminal in a second metal layer, wherein the planar resistor material includes a non-conductive core extending vertically from the first metal terminal in the first metal layer to the second metal terminal in the second metal layer; and
      a resistor material layer extending between a first bond pad and a second bond pad of a semiconductor device.

2. The method of claim 1, wherein the planar resistor material forming step includes:
   forming a trench in a dielectric layer of a first metal layer, the trench revealing a metal portion of a second metal layer thereunder;
   depositing a resistor material in the trench;
   planarizing the resistor material;
   forming at least one other metal layer over the first metal layer, each other metal layer including a resistor material filled trench; and
   forming a metal terminal in a last other metal layer, wherein the metal terminal contacts the resistor material.

3. The method of claim 2, wherein a value of a resistance of the resistor is determined by a number of metal layers in which the resistor is formed.

* * * * *